United States Patent [19]

Bland

[11] Patent Number: 5,614,869

[45] Date of Patent: Mar. 25, 1997

[54] HIGH SPEED DIVIDER FOR PHASE-LOCKED LOOPS

[75] Inventor: Christopher J. Bland, San Jose, Calif.

[73] Assignee: MicroClock Incorporated, San Jose, Calif.

[21] Appl. No.: 575,371

[22] Filed: Dec. 20, 1995

[51] Int. Cl.$^6$ .............................. H03K 21/38; H03L 7/193
[52] U.S. Cl. .............................. 331/1 A; 331/25; 377/44; 377/48; 377/52
[58] Field of Search ........................ 331/1 A, 25; 377/44, 377/48, 52

[56] References Cited

U.S. PATENT DOCUMENTS 4,179,670  12/1979  Kingsbury ................................. 331/25
4,633,194  12/1986  Kikuchi et al. .......................... 331/25

Primary Examiner—Siegfried H. Grimm
Attorney, Agent, or Firm—Townsend and Townsend and Crew LLP

[57] ABSTRACT

A high speed divider circuit is provided for phase-locked loops (PLLs). The divider circuit in the feedback loop of the PLL has two divider circuits, a prescalar divide-by-4 circuit, which receives the high frequency signal from the voltage-controlled oscillator (VCO) of the PLL, and a programmable divide-by-N circuit, which resets itself after counting up to N. Responsive to the reset signal from the divide-by-N circuit, the prescalar divider circuit divides the VCO signal by 4+P, where P is a programmable value. This programmable periodic change in the divisor of the prescalar divide circuit allows the divisor in the classic PLL frequency synthesis equation to be set to nearly any number so that the synthesized output frequency of the PLL can be set with very fine resolution.

10 Claims, 5 Drawing Sheets

(P = 0)

(P = 2)

5,614,869

HIGH SPEED DIVIDER FOR PHASE-LOCKED LOOPS

BACKGROUND OF THE INVENTION

The present invention is related to phase-locked loops and, more particularly, to divider circuits suitable for high speed clock rates.

Frequency synthesis by a phase-locked loop (PLL) circuit is a very common technique in widespread use in many sorts of electronic equipment. For example, frequency synthesis is now also used in computers and PLLs allow a high frequency clock to be generated from a lower frequency reference clock. This function is generally integrated onto a CMOS integrated circuit and is called a clock generator or clock synthesizer. A major problem with these integrated circuits is the accuracy of the synthesized clock.

PLL circuits typically have a programmable divider or counter block in the feedback path from the voltage-controlled oscillator (VCO) which generates the output signal. The tuning range of the VCO is normally quite large to allow the VCO to operate at high frequencies. This makes it difficult for the feedback divider block to operate accurately and destroys the accuracy of the synthesized clock signal. One solution to this problem is the placement of a prescalar divider or counter circuit between the VCO and the divider block in the feedback path. However, the fine tuning of the clock signal is lost and the tuning resolution of the signal is coarsened.

The present invention solves or substantially mitigates this problem with a programmable PLL having fine tuning of an accurate and high-speed output signal.

SUMMARY OF THE INVENTION

The present invention provides for a phase-locked loop circuit which has the main elements of a conventional PLL. The feedback divider circuit, which has an input terminal receiving an input clock signal at a frequency $f_{IN}$ and an output terminal sending an output clock signal $f_{OUT}$, has a first counter circuit connected to the input terminal. The first counter circuit is responsive to the input clock signal to count up to T, a multiple of 2, and resets itself to generate a first counter clock signal at a frequency of $f_{IN}$ divided by T at an output node.

The feedback divider circuit also has a second counter circuit connected to the output node of the first counter circuit and the output terminal. The second counter circuit is responsive to the first counter clock frequency to count up to a first amount V and resets itself to generate a second counter clock signal at the output terminal with a frequency of the first counter clock frequency divided by V and A, the number of clock cycles to restart the count. The second counter circuit generates a reset signal when the counter reaches the amount V. The first counter circuit is responsive to the reset signal so that the first counter circuit holding its count by a second amount P upon receiving the reset signal so that $$f_{OUT} = \frac{f_{IN}}{T(V+A)+P}$$

The amounts V and P are programmable. The resulting PLL can generate accurate signals at programmable high frequencies in extremely fine increments.

DETAILED DESCRIPTION OF PREFERRED EMBODIMENTS

It should be noted that in the description below of the elements of phase-locked loops (PLLs), the terms, divider circuits and counter, are used interchangeably. Counters operate as divider circuits. One term, or the other, is used to best describe the element and operation of the circuit.

Figure 1:
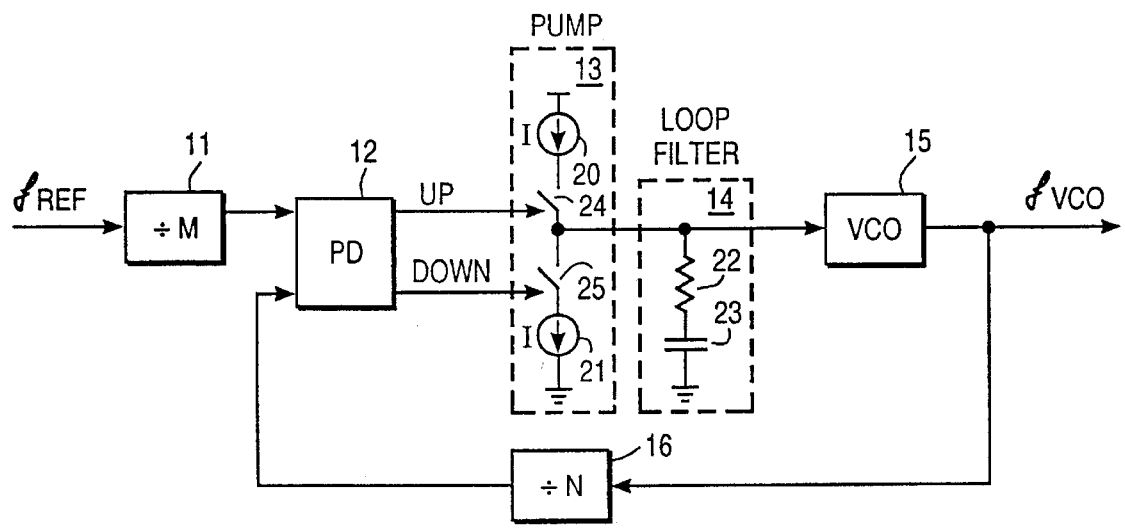
FIG. 1 is a block diagram of a conventional PLL.

FIG. 1 shows a block diagram of a conventional PLL for frequency synthesis. The PLL receives a signal with a reference frequency $f_{REF}$ at the PLL's input terminal. That terminal is connected to an input terminal of a divider circuit 11, which divides, or slows, the incoming signal by predetermined amount M. The output of divider circuit 11 is connected to one of two inputs of a phase detector circuit 12, which has its output connected to a charge pump circuit 13. The charge pump circuit is represented by switches 24 and 25 which are responsive to the phase detector circuit 12 and are connected to current source circuits 20 and 21 respectively. The charge pump circuit 13 is also connected to a loop filter circuit, a series-connected capacitor 23 and resistor 22, which provides a reference voltage to a voltage-controlled oscillator (VCO) 15 and is connected to the input terminal of the voltage-controlled oscillator. The VCO 15 has an output terminal forming the output terminal of the PLL.

The output terminal of the VCO 15 is also connected to a second divider circuit 16, which divides the frequency of the output signal by a predetermined amount N. A feedback relationship is established by the connection of the output of the divider circuit 16 to the second input of the phase detector circuit 12.

The operation of the PLL is as follows. The clock frequencies of the two input signals to the phase detector 12 are $f_{REF}/M$ and $f_{VCO}/N$ and the feedback arrangement of the PLL circuit keeps the two frequencies the same. The phase detector 12 compares the phase and frequency of the rising edges of the two input signals and generates one of three states. If the phase and frequency of the two input signals are the same, the loop is locked. Neither UP nor DOWN signal is asserted and the two switches 24 and 25 in the charge pump 13 remain open. The voltage stored on the loop filter capacitor 23 is unchanged and the voltage-controlled oscillator (VCO) 15 continues to run at the same frequency.

If the reference input to the phase detector circuit 12 is running faster than the VCO input, the output signal of the VCO 15 is running at too slow a frequency. In this case, the phase detector 12 generates an UP signal which turns on the upper switch 24 in the charge pump circuit 13 and so charges the loop filter capacitor 23 from the current source circuit 20. This raises the frequency of the VCO 15 signal until the two input signals to the phase detector circuit 12 are the same.

Conversely, if the reference input signal to the phase detector circuit 12 is running slower than the VCO output signal, the VCO 15 is running too fast. In this case, the phase detector circuit 12 generates a DOWN signal that turns on the lower switch 25 in the charge pump circuit 13 and so discharges the loop filter capacitor 23 through the current source circuit 21. This lowers the speed of the VCO 15 until the two input signals to the phase detector circuit 12 are the same.

As described above, a property of phase-locked loops in a steady state condition is that the feedback loop (the phase detector 12, charge pump 13, loop filter 14, VCO 15 and the divider circuit 16) makes the frequencies of the two input signals to the phase detector 12 equal. Since one input is $f_{REF}$ divided by M and the other input is $f_{VCO}$ divided by N then:

$$\frac{f_{REF}}{M} = \frac{f_{VCO}}{N} \text{ or } f_{VCO} = \frac{N}{M} f_{REF}$$

This is the basic equation for frequency synthesis and allows the generation of frequencies that are fractions of a reference frequency (the fraction can be greater than one).

Frequency synthesis is now also used in computers and allows a high frequency clock to be generated from a lower frequency reference clock. This function is generally integrated onto a CMOS integrated circuit called a clock generator or clock synthesizer. A major problem with these integrated circuits is the accuracy of the synthesized clock. This is determined by the equation above and the characteristics of CMOS PLLS.

The divide-by-N circuit 16 in the feedback loop is a digital divider (or counter) and has some tight constraints placed upon it. The two most important are:

1. The number N must be programmable, e.g., from a ROM or registers.
2. The counter must operate correctly regardless of the VCO speed.

Figure 2:
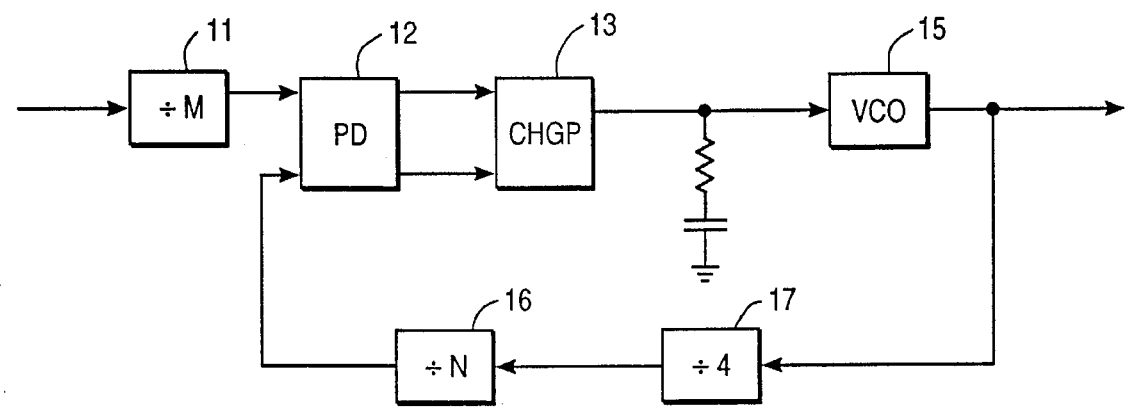
FIG. 2 is a block diagram of a conventional PLL having a prescalar divider circuit.

The tuning range of the VCO in a CMOS PLL is typically quite large. This allows the VCO to operate at high frequencies. This makes the second constraint difficult to meet. The usual solution is to precede the counter 16 with a fixed high speed prescaler circuit 17, which provides, for example, a divide-by-4 function, as shown in FIG. 2. It is straightforward to design fixed high-speed dividers with divisors in multiples of 2. The programmable divide-by-N circuit 16 now only runs at a quarter of the VCO speed. This makes the design of the programmable divider simple.

The problem with this solution is a loss of resolution since the total feedback divide can now only be changed in increments of 4. The synthesis equation now becomes:

$$f_{VCO} = 4 \frac{N}{M} f_{REF}$$

On the other hand, the present invention provides for a high speed divider circuit that is fully programmable and removes the fixed prescaler circuit 17. This restores the full potential resolution of the PLL synthesizer.

Figure 3:
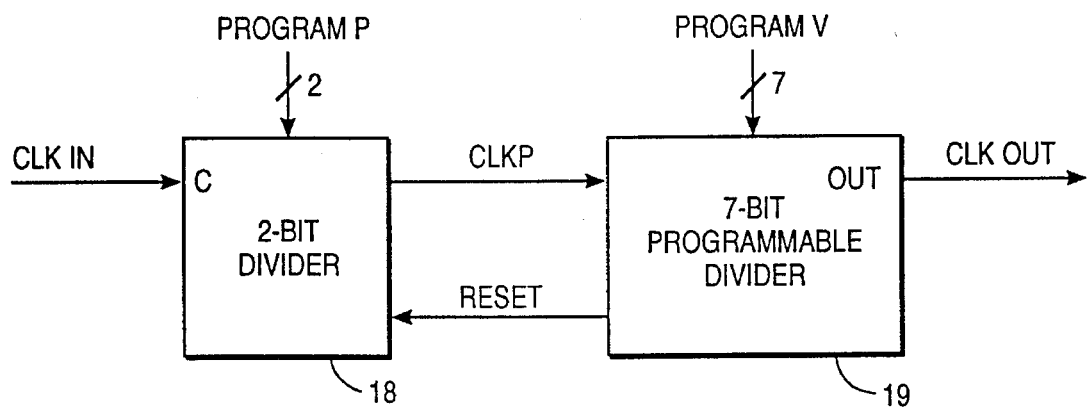
FIG. 3 is a block diagram of a feedback divider according to the present invention.

FIG. 3 is a block diagram of the divider circuit according to one embodiment of the present invention. This divider circuit is used in place of the programmable divide-by-N circuit 16 and the prescalar circuit 17 in the PLL of FIG. 2. The circuit of the present invention is formed by a programmable 2-bit prescaler circuit 18 which receives the feedback signal from the VCO 15. The circuit 18 is connected to a 7-bit programmable divider circuit 19. The present invention retains a relatively slow divide-by-N (the 7-bit divider 19) function by using the 2-bit prescaler circuit 18. The divisor of the pre-scaler circuit 18 is always 4 or greater.

The operation of the circuit is as follows. The 2-bit divider circuit 18 is configured as a divide-by-4. The 7-bit divider circuit 19 operates by counting up to V (the number programmed on the 7 input lines) and then generating a RESET signal. The RESET signal returns the counter 19 to zero and is then removed so that the counter 19 can count up to V again. The process of resetting the counter 19 and removing the RESET signal takes 2 clock cycles so that the total divisor of the clock signal from the 2-bit divider circuit 18, CLKP, is:

$$N = V + 2$$

Figure 5:
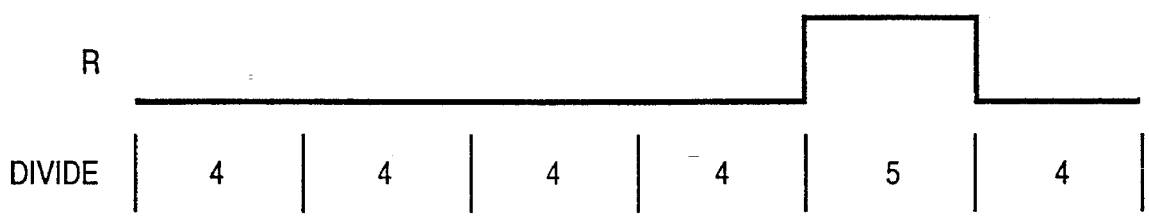
FIG. 5 is a timing signal diagram illustrating the operation of the divider circuit of the 2-bit programmable divider of FIG. 4B.

The RESET signal is fed into an input terminal of the 2-bit divider 18. When the RESET signal is asserted, the 2-bit divider 18 extends the divide period by the number of cycles (of CLKIN, the output clock signal from the VCO) programmed on P. For example, if P=1 then when the RESET signal is low, the 2-bit divider operates as a divide-by-4 until the RESET signal is high when it operates as a divide-by-5 before reverting to a divide-by-4 circuit. This is illustrated in FIG. 5. This means:

$$CLKOUT = \frac{CLKIN}{4(V+2) + P}$$

where $P = 0, 1, 2, 3$ $V = 1, 2, 3 \ldots 126, 127$

This is effectively a 9-bit divider without any pre-scaler. From this equation, any number between 12 and 519 can be programmed as a divisor.

Figure 4A:
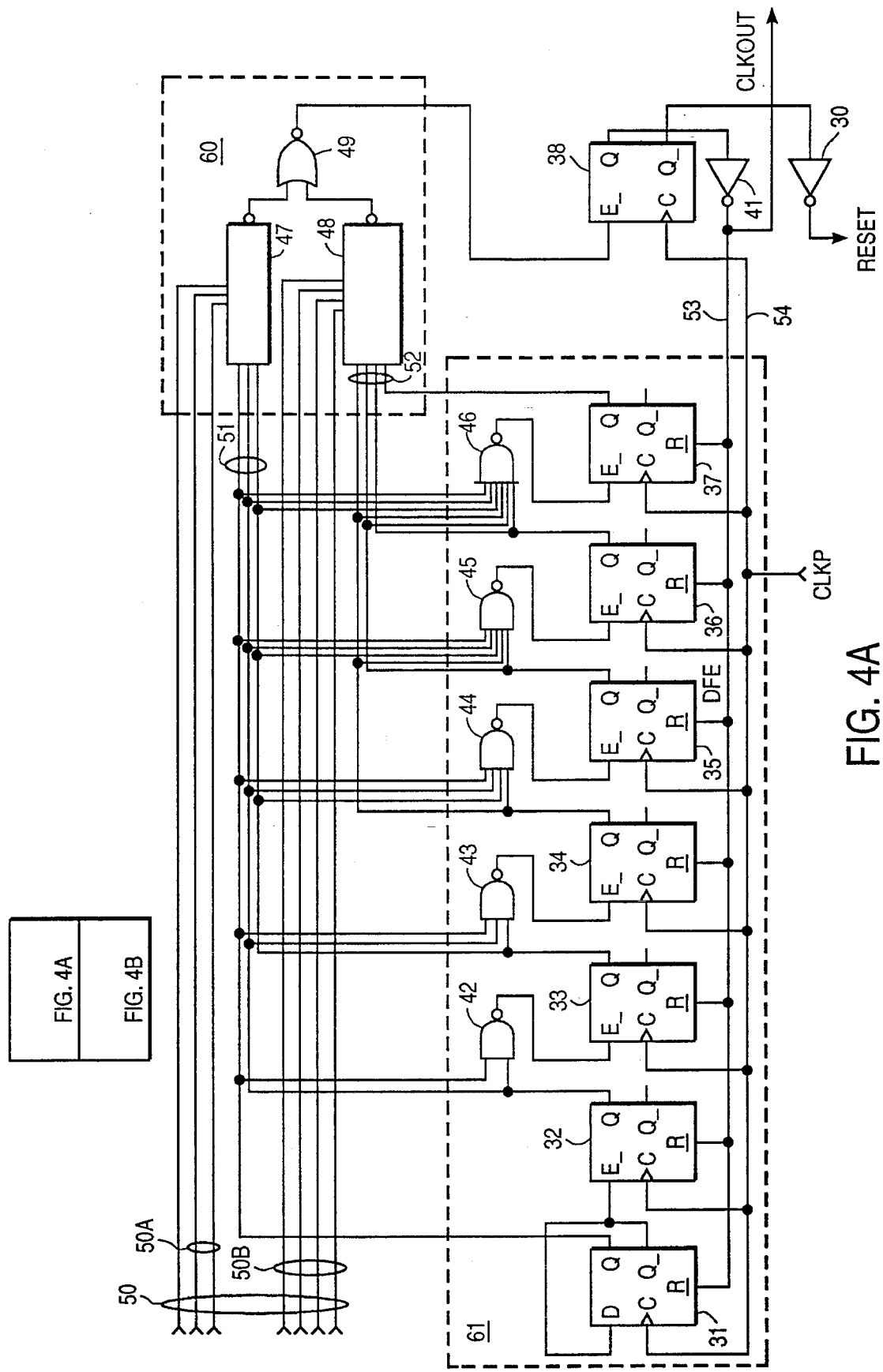
FIG. 4A is a circuit diagram of the 7-bit divider of FIG. 3.
Figure 4B:
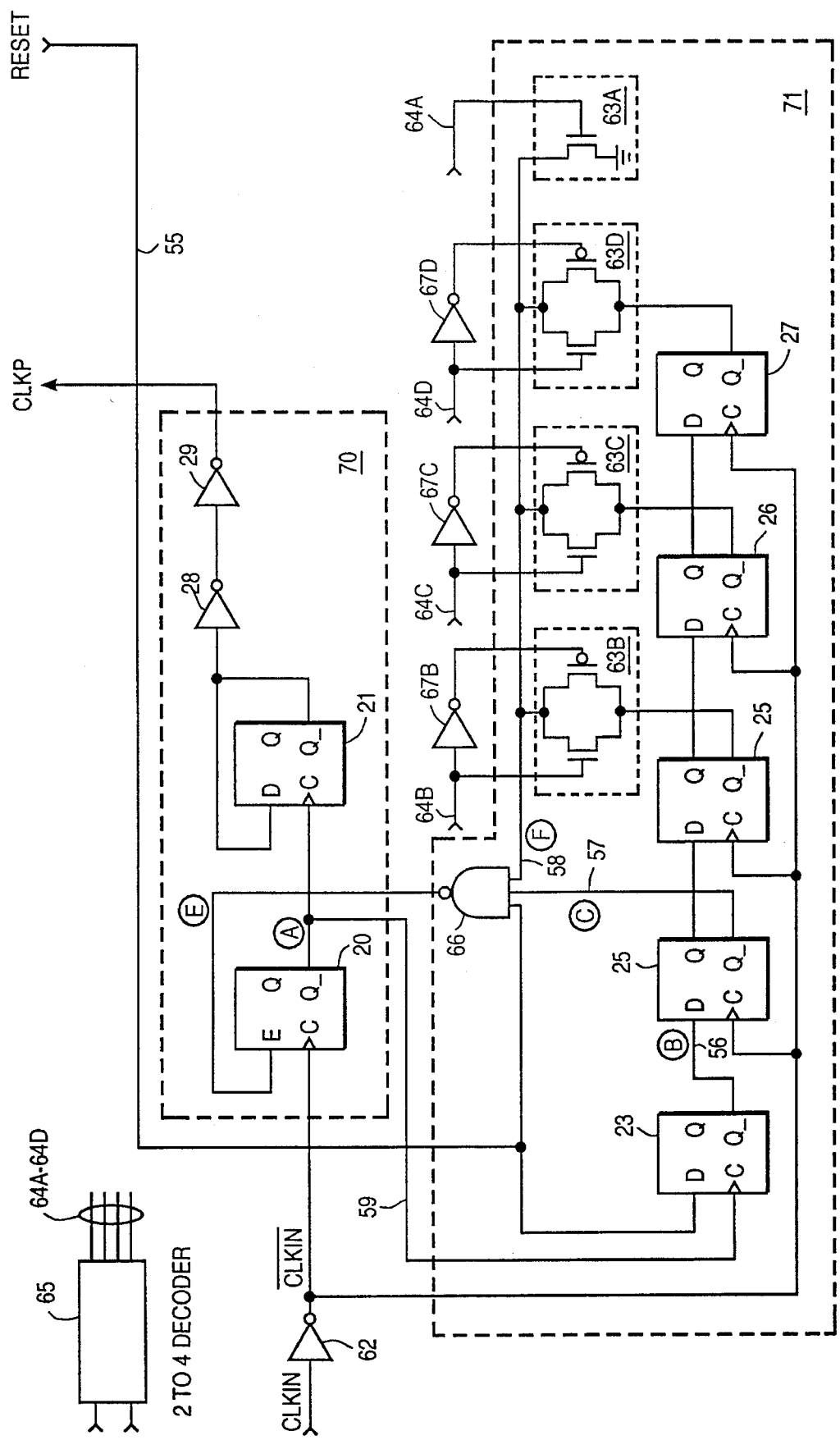
FIG. 4B is a circuit diagram of the 2-bit programmable divider of FIG. 3.

FIGS. 4A and 4B illustrate the details of this divider circuit. The circuit in FIG. 4A is the synchronous programmable 7-bit counter or divider 19. Clocked D-type flip-flop 31 and toggle flip-flops 32–37 receive the CLKP clock signal from the prescalar circuit 18 (detailed in FIG. 4B) at their clock input terminals over a signal line 54. The flip-flops 32–37 have an enable terminal for an E_signal. When the E_signal is low, the outputs Q and Q-bar toggle on the next rising edge of the clock signal. If the E_signal is high, the signals at the output terminals of the flip-flops remain unchanged. The Q output terminals of each flip-flop 32–36 are connected to the input terminals of succeeding NAND gates 42–46, each having an output terminal connected to the input terminal of a corresponding flip-flop 33–37. The Q output terminal of the flip-flop 32 is connected to the input terminals of the NAND gates 42–46, the Q output terminal of the flip-flop 33 is connected to the input terminals of the NAND gates 43–46, the Q output terminal of the flip-flop 34 is connected to the input terminals of the NAND gates 44–46, and so forth. The complementary Q-bar output terminal of the first flip-flop 31 is connected directly to the input terminal of the flip-flop 32 and to the input terminal of the flip-flop 31 in a feedback loop.

The Q output terminal of the flip-flops 31–33 are connected to input terminals of a comparator 47 over lines 51 and the Q output terminals of the remaining flip-flops 34–37 are connected to the input terminals of a comparator 48 over lines 52. The comparators 47, 48, each operationally a complex OR-NAND gate, and a NOR gate 49 form a magnitude comparator 60. The comparator 47 also has three input terminals connected by lines 50A, which carry the least significant bits (LSBs) from a storage element, such as a register or a ROM, holding the amount V discussed above. The comparator 48 also has four input terminals connected by lines 50B, which carry the most significant bits (MSBs) from the storage element holding the amount V. The output terminals of the two comparators 47 and 48 are connected to the input terminals of the NOR gate 49.

The output terminal of the NOR gate 49 is received at the input terminal by a D-type flip-flop 38 which is also clocked by the CLKP signal over the line 54. The Q output terminal of the flip-flop 38 is connected to an inverter 41 having its output terminal connected to a line 53 connected to reset terminals of the flip-flops 31–37. The Q-bar output terminal of the flip-flop 38 is connected to an inverter 30 having its output terminal connected to a RESET line to the counter 18 on FIG. 4B.

The clocked flip-flops 31–37 and NAND gates 42–46 form a 7-bit synchronous counter 61. The counter starts at 0 and then increments by 1 on each rising edge of CLKP. The count is presented on the lines 51 and 52 to the comparators 47 and 48 respectively. The externally programmed count V is presented on the lines 50 (formed by lines 50A and 50B) to the comparators 47 and 48. The LSBs are received by the comparator 47 and the MSBs by the comparator 48. When the two counts are the same, i.e., the count on the lines 50A from the V storage element and the lines 51 from the flip-flops 31–33 and the count on lines 50B from the V storage element and the flip-flops 34–37, the output of the NOR gate 49 goes high.

On the next rising edge of CLKP, this signal is clocked through the flip-flop 38 generating the reset signal to the synchronous counter 61 through an inverter 41 and a line 53. This returns the counter to 0 which makes the output of the NOR gate 49 go low. On the next rising edge of CLKP, this output signal is clocked through the flip-flop 38 which removes the reset signal so that the counter can begin counting again on the next rising edge of CLKP. Hence the overall counter 61 divides the input clock (CLKP) by the number presented on the lines 50 (V) plus 2 additional clock cycles (to generate and remove the reset signal). Thus the divider circuit of FIG. 4A has a divisor of V+2 upon the CLKP signal from the prescalar circuit 18.

The circuit in FIG. 4B details the 2-bit pre-scaler circuit 18. A storage element (not shown), such as a register or ROM, holds two bits for the amount P. The storage element is connected to a 2-to-4 decoder 65 which generates four output signals on corresponding lines 64 (64A–64D). After inversion by an inverter 62, the incoming clock signal, CLKIN, is received by a clock divider block 70 and a clock elongation block 71. The clock divider block 70 divides the CLKIN signal by a multiple of 2, four in this case, to generate the CLKP signal for the 7-bit divider circuit 19 in FIG. 4A. Upon receiving a RESET signal from the 7-bit divider circuit 19, the clock elongation block 71 generates a signal to the clock divider block 70 so that the clock signal is stalled by P cycles of the CLKIN clock signal. In effect, the clock signal from the block 70 is "elongated" by P.

The clock divider block 70 has two flip-flops 20 and 21 and two inverters 28 and 29. The output terminal of the inverter 62 is connected to the clock input terminal of the flip-flop 20. The complementary Q-bar output terminal of the flip-flop 20 is connected to the clock input terminal of the flip-flop 21, whose complementary Q-bar output terminal is connected to its own data input terminal in a feedback loop. The complementary Q-bar output terminal of the flip-flop 21 is also connected to two series-connected inverters 28 and 29 and to an output terminal carrying the CLKP signal to the circuit 19 in FIG. 4A.

The clock elongation block 71 has flip-flops 23–27, a transistor 63A, transmission gates 63B–63D and a NAND gate 66. The complementary Q-bar output terminal of the flip-flop 20 is connected to the clock input terminal of the flip-flop 23 whose own complementary Q-bar output terminal is connected to the data input terminal of the flip-flop 24. The Q output terminal of the flip-flop 24 is connected to the data input terminal of the flip-flop 25 and the complementary Q-bar output terminal is connected to one input terminal of the NAND gate 66 by a signal line 57, node C. The Q output terminal of the flip-flop 25 is connected to the input terminal of the flip-flop 26 whose Q output terminal is connected to the data input terminal of the flip-flop 27. The clock terminals of the flip-flops 24–27 are connected to the output terminal of the inverter 62.

The complementary Q-bar output terminals of the flip-flops 25–27 are respectively connected to the transmission gates 63B–63D respectively, which are formed by paired NMOS and PMOS transistors. The opposite terminals of the transmission gates 63B–63D are connected by a line 58, node F, to a second input terminal of the NAND gate 66. The transmission gates 63B–63D are controlled by the signals on the selection lines 64B–64D respectively from the decoder 65. The gate electrodes of the NMOS transistors of the gates 63B–63D are connected directly to the lines 64B–64D and the gate electrodes of the PMOS transistors of the gates 63B–63D are connected to the lines 64B–64D through inverters 67B–67D respectively. Also, the line 58 is connected to a source/drain terminal of an NMOS transistor 63A which has its gate electrode connected to the selection line 64A from the decoder 65. The other source/drain terminal of the transistor 63A is connected to ground.

Besides the connections to the line 58 (node F) and the line 57 (node C), the NAND gate 66 has a third input terminal connected to a RESET line 55. The output terminal of the NAND gate 66 is connected by a line 68, node E, to the data input terminal of the flip-flop 20. Through an inverter 30, the RESET line 55 is connected to the complementary Q-bar output terminal of the flip-flop 38 of the divider circuit 19 on FIG. 4A. The RESET line is also connected to the data input terminal of the flip-flop 23.

The flip-flop 20 is a high-speed divide-by-2 which is enabled by the signal on the node E. It operates similarly to a JK flip-flop with J=K so that the output signals toggle back and forth. When the node E is high, the output signals change on each rising edge of clock CLKIN-bar from the inverter 62. The flip-flop 20 operates as a divide-by-2 circuit, as illustrated by the FIG. 6A timing diagram for the node A. If the node E is low, the output signals remain unchanged as the flip-flop 20 is clocked. In turn, the output signal (at the node A) from the flip-flop 20 is divided by 2 again by the flip-flop 21. Thus the output signal of the flip-flop 21, CLKP, is CLKIN/4.

Figure 6A:
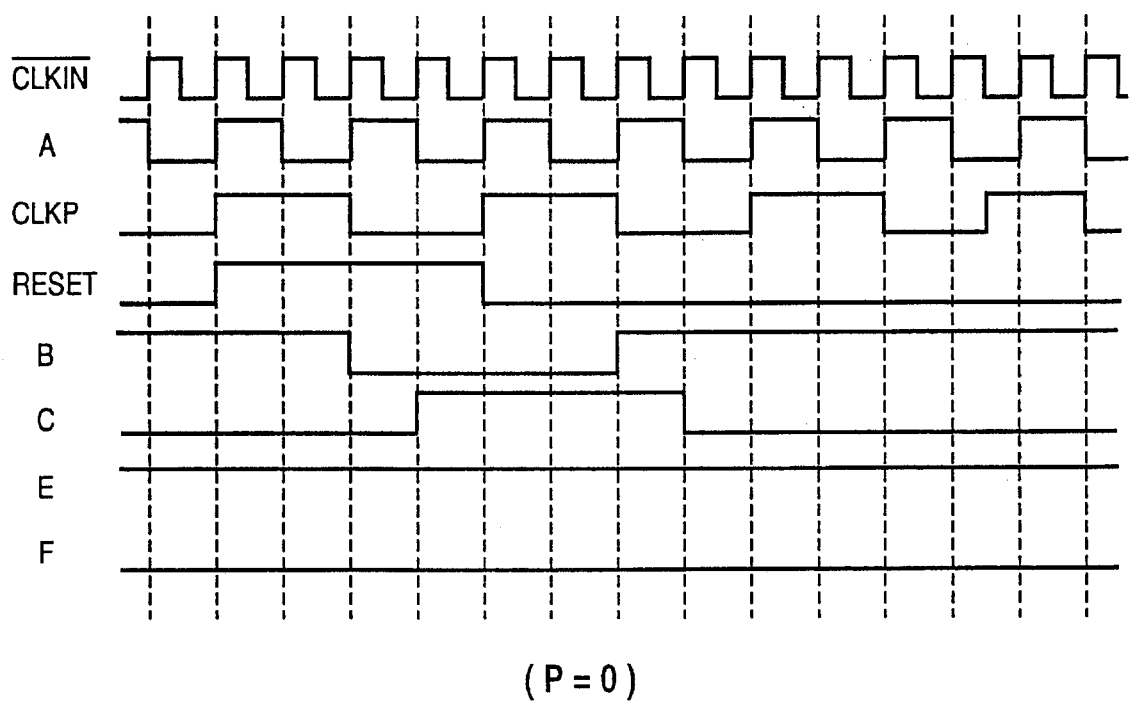
FIG. 6A is a timing signal diagram for the 2-bit programmable divider circuit when the programmed amount P=0.
Figure 6B:
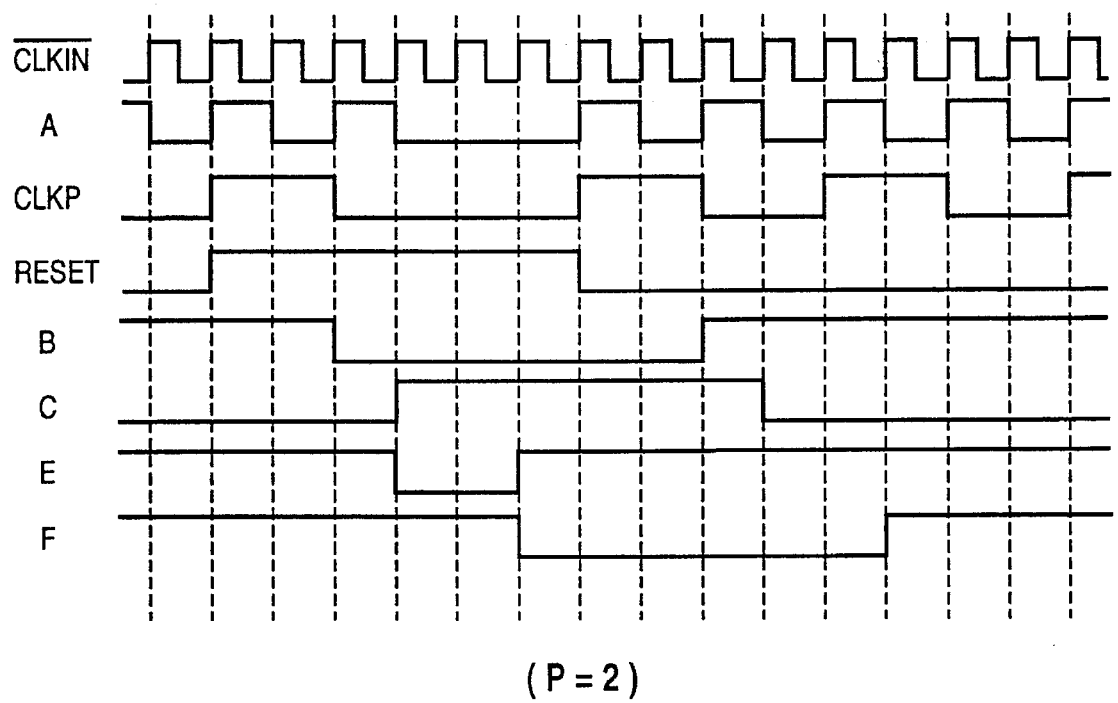
FIG. 6B is a timing signal diagram for the 2-bit programmable divider circuit when the programmed amount P=2.

The pre-scaler circuit 18 stretches the period of CLKP by the number of clock cycles of CLKIN by the programmed amount P. For purposes of comparison, FIG. 6A shows the timing signals at different nodes of the circuit 18 when P=0. The signal on the line 64A from the decoder 65 is high, the transistor 63A is turned on and the line 58 is pulled low. Since the voltage at the node F is low, the node E is high. This makes the pre-scaler always operate as a divide-by-4 counter. FIG. 6B shows a timing diagram at different nodes of the circuit 18 when P=2. With an occurrence of a RESET signal from the 7-bit divider circuit 19 in FIG. 4A, the node E is low for the amount of CLKIN cycles specified by the amount P in the storage element connected to the decoder 65. The signal at the node E from the NAND gate 66 "stretches" the resulting CLKP signal.

For example, the RESET signal goes high on the rising edge of the CLKP signal. On the next rising edge of the signal at the node A, the RESET signal is clocked through the flip-flop 23 making the node B go low. Then on the next rising edge of CLKIN signal, the node B is clocked through the flip-flop 24 making the node C go high. The combination of logic signals to the NAND gate 66 at this time forces the node E low which disables the flip-flop 20 (the divide-by-2 circuit). On the next rising edge of CLKIN signal, the high signal at the node C is clocked through the flip-flop 25 and then on the next rising edge the high node C signal is clocked through the flip-flop 26. The transmission gate 63C is turned on by the decoded signal on the line 64C (since P=2) and so the line 58 is pulled down and the node F goes low. This makes the node E go high again, enabling the flip-flop 20. Therefore the flip-flop 20 has been disabled for 2 cycles of the CLKIN signal and the CLKP signal is stretched by 2 cycles of CLKIN signal.

Effectively, the 2-bit pre-scaler circuit 18 operates as a divide-by-4 circuit until the RESET signal goes high. Then the circuit 18 changes to a divide-by-6 for one divide cycle before reverting to a divide-by-4 circuit. This adds 2 bits of resolution to the 7-bit divider to create a 9-bit divider circuit.

While various preferred and alternate embodiments of the present invention have been disclosed and described in detail, it should be evident that the present invention is equally applicable by making appropriate modifications to the embodiment described above. Therefore, the above description should not be taken as limiting the scope of invention which is defined by the metes and bounds of the appended claims.

What is claimed is:

1. A phase-locked loop circuit having an input terminal receiving a first signal at a reference frequency and an output terminal transmitting a second signal at an output frequency, said circuit comprising a first divider connected to said input terminal for generating an output signal at said reference frequency divided by a first variable integer M;

a second divider connected to said output terminal for generating an output signal at said output frequency divided by second variable amount, T(V+2)+P, where V and P are variable integers and T is a multiple of 2;

a circuit for supplying a reference voltage;

a voltage-controlled oscillator having an output node connected to said output terminal and an input node connected to said reference voltage circuit;

a phase detector having first and second input nodes, said first input node connected to an output node of said first divider, said second input node connected to an output node of said second divider, said phase detector generating an output signal indicative of a difference between said first and second divider output signals; and a charge pump connected to said phase detector and to said reference voltage circuit, said charge pump responsive to said phase detector output signal for varying said reference voltage of said reference voltage circuit so that the output frequency from said voltage-controlled oscillator varies;

whereby said phase-locked loop circuit can generate accurate signals at programmable high frequencies in extremely fine increments.

2. The phase-locked loop of claim 1 wherein P and V are programmable.

3. The phase-locked loop of claim 2 wherein T comprises 4.

4. The phase-locked loop of claim 3 wherein P comprises a first integer from 0–3, and V comprises a second integer from 1–127.

5. A divider circuit for a phase-locked loop, said divider circuit having an input terminal receiving an input clock signal at a frequency $f_{IN}$ and an output terminal sending an output clock signal $f_{OUT}$, said divider circuit comprising a first counter circuit connected to said input terminal, said first counter circuit responsive to said input clock signal to count up to T, a multiple of 2, and resetting itself to generate a first counter clock signal at a frequency of $f_{IN}$ divided by T at an output node; and a second counter circuit connected to said output node of said first counter circuit and to said output terminal, said second counter circuit responsive to said first counter clock frequency to count up to a first amount V and resetting itself to generate a second counter clock signal at said output terminal at a frequency of said first counter clock frequency divided by V and A, a number of clock cycles to restart said count, said second counter circuit generating a reset signal when said count reaches said amount V;

wherein said first counter circuit is responsive to said reset signal, said first counter circuit holding its count by a second amount P upon receiving said reset signal so that $$f_{OUT} = \frac{f_{IN}}{T(V+A)+P}$$

6. The divider circuit of claim 5 wherein said first counter circuit comprises a clock divider block connected to said input terminal and said output node dividing $f_{IN}$ of said input signal by T; and a clock elongation block connected to said clock divider block and responsive to said reset signal, said clock elongation block generating a signal to said clock divider block so that said clock divider block is stalled by P cycles of said input signal.

7. The divider circuit of claim 6 wherein said clock divider block comprises at least one flip-flop toggling responsive to said input clock signal, said flip-flop coupled to said output node, said flip-flop suspending toggling responsive to clock elongation block signal.

8. The divider circuit of claim 7 wherein said clock elongation block comprises at least one logic gate having a plurality of input terminals receiving said reset signal and a signal indicative of P input signal cycles after reception of said reset signal so that said logic gate asserts said clock elongation signal upon said reset signal and P cycles thereafter.

9. The divider circuit of claim 8 wherein said signal indicative of P input signal cycles after reception of said reset signal clock is programmable.

10. The divider circuit of claim 9 wherein said first amount V is programmable.

* * * * *